(12) United States Patent
Nam et al.

(10) Patent No.: US 9,847,462 B2
(45) Date of Patent: Dec. 19, 2017

(54) ARRAY SUBSTRATE FOR MOUNTING CHIP AND METHOD FOR MANUFACTURING THE SAME

(71) Applicant: Point Engineering Co., Ltd., Asan-si, Chungcheongnam-do (KR)

(72) Inventors: Ki Myung Nam, Cheonan-si (KR); Seung Ho Park, Hwaseong-si (KR); Young Chul Jun, Ansan-si (KR)

(73) Assignee: Point Engineering Co., Ltd., Asan-si, Chungcheongnam-do (KR)

( * ) Notice: Subject to any disclaimer, the term of this patent is extended or adjusted under 35 U.S.C. 154(b) by 96 days.

(21) Appl. No.: 14/525,478

(22) Filed: Oct. 28, 2014

(65) Prior Publication Data

US 2015/0115310 A1 Apr. 30, 2015

(30) Foreign Application Priority Data

Oct. 29, 2013 (KR) .................. 10-2013-0129171
Oct. 29, 2013 (KR) .................. 10-2013-0129287

(51) Int. Cl.
*H01L 33/48* (2010.01)
*H01L 23/00* (2006.01)

(52) U.S. Cl.
CPC ............ *H01L 33/486* (2013.01); *H01L 24/97* (2013.01); *H01L 2224/48091* (2013.01); *H01L 2924/12041* (2013.01); *H01L 2933/0033* (2013.01)

(58) Field of Classification Search
CPC ............ H01L 33/486; H01L 33/20; F21S 4/28
See application file for complete search history.

(56) References Cited

U.S. PATENT DOCUMENTS

| 3,621,550 A | 11/1971 | Colestock |
| 4,685,706 A | 8/1987 | Kowal et al. ................. 285/322 |

(Continued)

FOREIGN PATENT DOCUMENTS

| CN | 101312185 A | 11/2008 | .......... H01L 25/075 |
| DE | 10056776 A1 | 10/2001 | ............. H01L 49/02 |

(Continued)

OTHER PUBLICATIONS

Machine translation of KR 10-1306247.*

(Continued)

*Primary Examiner* — Daniel Whalen
*Assistant Examiner* — Suberr Chi
(74) *Attorney, Agent, or Firm* — Sunstein Kann Murphy & Timbers LLP

(57) ABSTRACT

Provided is an array substrate for mounting a chip. The array substrate includes a plurality of conductive layers unidirectionally stacked with respect to an original chip substrate; a plurality of insulating layers alternately stacked with the plurality of conductive layers, and electrically separate the plurality of conductive layers; and a cavity having a groove of a predetermined depth with respect to a region including the plurality of insulating layers in an upper surface of the original chip substrate. Accordingly, since the optical device array of a single structure is used as a line source of light, an emission angle emitted from the optical device is great, it is not necessary to form an interval for supplying an amount of light, and a display device can be simply constructed. Further, since it is not necessary to perform soldering a plurality of LED packages on a printed circuit board, a thickness of a back light unit can be reduced.

3 Claims, 28 Drawing Sheets

(56) References Cited

U.S. PATENT DOCUMENTS

| | | | |
|---|---|---|---|
| 4,722,914 A | 2/1988 | Drye et al. | 437/213 |
| 5,344,795 A | 9/1994 | Hashemi et al. | 437/214 |
| 5,844,286 A | 12/1998 | Hase | 257/417 |
| 6,054,780 A | 4/2000 | Haigh et al. | 307/91 |
| 6,087,882 A | 7/2000 | Chen et al. | 327/333 |
| 6,118,357 A | 9/2000 | Tomasevic et al. | 333/247 |
| 6,239,496 B1 | 5/2001 | Asada | 257/777 |
| 6,271,801 B2 | 8/2001 | Tuttle et al. | 343/872 |
| 6,303,011 B1 | 10/2001 | Gao et al. | 204/425 |
| 6,309,912 B1 | 10/2001 | Chiou et al. | 438/118 |
| 6,330,741 B1 | 12/2001 | Wright et al. | 29/600 |
| 6,528,351 B1 | 3/2003 | Nathan et al. | 438/118 |
| 6,593,662 B1 | 7/2003 | Pu et al. | 257/777 |
| 6,599,768 B1 | 7/2003 | Chen | 438/22 |
| 6,639,324 B1 | 10/2003 | Chien | 257/778 |
| 6,740,903 B2 | 5/2004 | Isoda | 257/81 |
| 6,777,659 B1 | 8/2004 | Schwarte | 250/208.1 |
| 6,784,023 B2 | 8/2004 | Ball | 438/113 |
| 6,844,606 B2 | 1/2005 | Logsdon et al. | 257/434 |
| 6,913,949 B2 | 7/2005 | Pflughaupt et al. | 438/109 |
| 6,917,089 B2 | 7/2005 | Schuurmans et al. | 257/427 |
| 6,928,726 B2 | 8/2005 | Zollo et al. | 29/832 |
| 6,987,661 B1 | 1/2006 | Huemoeller et al. | 361/312 |
| 7,002,254 B2 | 2/2006 | Harper et al. | 257/777 |
| 7,075,329 B2 | 7/2006 | Chen et al. | 326/21 |
| 7,112,885 B2 | 9/2006 | Chen et al. | 257/728 |
| 7,134,193 B2 | 11/2006 | Sasaoka et al. | 29/825 |
| 7,183,643 B2 | 2/2007 | Gibson et al. | 257/723 |
| 7,196,426 B2 | 3/2007 | Nakamura et al. | 257/778 |
| 7,198,986 B2 | 4/2007 | Sunohara | 438/109 |
| 7,214,565 B2 | 5/2007 | Sunohara | 438/108 |
| 7,217,888 B2 | 5/2007 | Sunohara et al. | 174/260 |
| 7,230,318 B2 | 6/2007 | Kripesh et al. | 257/621 |
| 7,242,089 B2 | 7/2007 | Minervini | 257/704 |
| 7,242,591 B2 | 7/2007 | Imamura et al. | 361/761 |
| 7,251,391 B2 | 7/2007 | Murayama | 385/15 |
| 7,286,366 B2 | 10/2007 | Zollo et al. | 361/761 |
| 7,288,433 B2 | 10/2007 | Haba et al. | 438/107 |
| 7,312,536 B2 | 12/2007 | Yamano et al. | 257/787 |
| 7,319,049 B2 | 1/2008 | Oi et al. | 438/106 |
| 7,319,598 B2 | 1/2008 | Steiner et al. | 361/760 |
| 7,325,301 B2 | 2/2008 | Miura | 29/852 |
| 7,326,932 B2 | 2/2008 | Hynes et al. | 250/353 |
| 7,335,531 B2 | 2/2008 | Iijima et al. | 438/106 |
| 7,340,147 B2 | 3/2008 | Yonekura et al. | 385/14 |
| 7,426,868 B2 | 9/2008 | Fessele et al. | 73/756 |
| 7,517,712 B2 | 4/2009 | Stark | 438/51 |
| 7,551,454 B2 | 6/2009 | Wuchse et al. | 361/761 |
| 7,692,444 B2 | 4/2010 | Chen et al. | 326/21 |
| 7,697,301 B2 | 4/2010 | Lee et al. | 361/761 |
| 7,834,438 B2 | 11/2010 | Shiraishi et al. | 257/684 |
| 7,872,418 B2 | 1/2011 | Hata et al. | 313/512 |
| 7,901,989 B2 | 3/2011 | Haba et al. | 438/110 |
| 7,902,843 B2 | 3/2011 | Fang et al. | 324/686 |
| 8,018,032 B2 | 9/2011 | Lu | 257/622 |
| 8,154,031 B2 | 4/2012 | Grotsch et al. | 257/88 |
| 8,351,634 B2 | 1/2013 | Khenkin | 381/361 |
| 8,390,083 B2 | 3/2013 | O'Donnell et al. | 257/414 |
| 8,415,704 B2 | 4/2013 | Ivanov et al. | 257/99 |
| 8,513,789 B2 | 8/2013 | Haba et al. | 257/678 |
| 8,779,532 B2 | 7/2014 | O'Donnell et al. | 257/414 |
| 2003/0059976 A1 | 3/2003 | Nathan et al. | 438/106 |
| 2003/0193083 A1 | 10/2003 | Isoda | 257/668 |
| 2003/0193088 A1 | 10/2003 | Hall et al. | 257/713 |
| 2004/0016995 A1 | 1/2004 | Kuo et al. | 257/678 |
| 2004/0135952 A1 | 7/2004 | Kurashina et al. | 349/139 |
| 2004/0195581 A1 | 10/2004 | Isoda | 257/99 |
| 2005/0046011 A1 | 3/2005 | Chen et al. | 257/777 |
| 2005/0046041 A1 | 3/2005 | Tsai | 257/778 |
| 2005/0087356 A1 | 4/2005 | Forcier | 174/52.4 |
| 2005/0176209 A1 | 8/2005 | Jorgenson et al. | 438/381 |
| 2006/0033112 A1 | 2/2006 | Isoda | 257/79 |
| 2006/0215379 A1 | 9/2006 | Zollo et al. | 361/761 |
| 2006/0246617 A1 | 11/2006 | Lee et al. | 438/26 |
| 2006/0246630 A1 | 11/2006 | Sunohara et al. | 438/125 |
| 2006/0258053 A1 | 11/2006 | Lee et al. | 438/118 |
| 2006/0283627 A1 | 12/2006 | Chen et al. | 174/260 |
| 2007/0029654 A1 | 2/2007 | Sunohara et al. | 257/678 |
| 2007/0126102 A1 | 6/2007 | Mohammed et al. | 257/686 |
| 2007/0128754 A1 | 6/2007 | Fuergut et al. | 438/48 |
| 2007/0131349 A1 | 6/2007 | Tuominen et al. | 156/280 |
| 2007/0132536 A1 | 6/2007 | Lee et al. | 336/200 |
| 2007/0143991 A1 | 6/2007 | Bauer et al. | 29/830 |
| 2007/0158822 A1 | 7/2007 | Fujii | 257/704 |
| 2007/0177360 A1 | 8/2007 | Shiraishi et al. | 361/740 |
| 2007/0181988 A1 | 8/2007 | Han et al. | 257/678 |
| 2007/0187826 A1 | 8/2007 | Shim et al. | 257/738 |
| 2007/0190686 A1 | 8/2007 | Wang | 438/106 |
| 2007/0241451 A1 | 10/2007 | Koizumi et al. | 257/719 |
| 2007/0290329 A1 | 12/2007 | Murayama et al. | 257/704 |
| 2008/0029879 A1 | 2/2008 | Tuckerman et al. | 257/704 |
| 2008/0040921 A1 | 2/2008 | Zollo et al. | 29/837 |
| 2008/0044127 A1 | 2/2008 | Leising et al. | 385/14 |
| 2008/0050847 A1 | 2/2008 | Gluschenkov et al. | 438/6 |
| 2008/0054486 A1 | 3/2008 | Murayama et al. | 257/774 |
| 2008/0073768 A1 | 3/2008 | Shiraishi et al. | 257/684 |
| 2008/0094805 A1 | 4/2008 | Tuominen et al. | 361/728 |
| 2008/0171172 A1 | 7/2008 | Bae et al. | 428/67 |
| 2008/0179602 A1 | 7/2008 | Negley et al. | 257/88 |
| 2008/0192450 A1 | 8/2008 | Tuominen et al. | 361/761 |
| 2008/0196930 A1 | 8/2008 | Tuominen et al. | 174/260 |
| 2008/0202801 A1 | 8/2008 | Tuominen et al. | 174/260 |
| 2008/0231169 A1 | 9/2008 | Hata et al. | 313/500 |
| 2009/0041913 A1 | 2/2009 | Weber et al. | 426/279 |
| 2009/0096041 A1 | 4/2009 | Sakakibara et al. | 257/419 |
| 2009/0101998 A1 | 4/2009 | Yen et al. | 257/416 |
| 2009/0184090 A1 | 7/2009 | Wuchse et al. | 216/13 |
| 2009/0230525 A1 | 9/2009 | Chang Chien et al. | 257/676 |
| 2010/0059877 A1 | 3/2010 | Leib et al. | 257/704 |
| 2010/0093905 A1 | 4/2010 | Elizalde et al. | 524/378 |
| 2010/0157583 A1 | 6/2010 | Nakajima | 362/184 |
| 2010/0207142 A1 | 8/2010 | Chen et al. | 257/98 |
| 2010/0308450 A1 | 12/2010 | Verjus et al. | 257/690 |
| 2011/0241039 A1* | 10/2011 | Liao | H01L 25/0753 257/91 |
| 2013/0062632 A1* | 3/2013 | Lee | H01L 25/0753 257/88 |

FOREIGN PATENT DOCUMENTS

| | | | |
|---|---|---|---|
| JP | 09-055535 A | 2/1997 | H01L 33/00 |
| JP | 2000-236116 A | 8/2000 | H01L 33/00 |
| JP | 2003-303999 | 10/2003 | H01L 33/00 |
| JP | 2003-309292 A | 10/2003 | H01L 33/00 |
| JP | 2004-119981 | 4/2004 | H01L 33/00 |
| JP | 2007-036132 | 2/2007 | H01L 33/00 |
| JP | 2007-134494 | 5/2007 | H01L 33/00 |
| JP | 2009-21264 | 1/2009 | F21V 29/00 |
| KR | 1020050014769 | 2/2005 | H01L 33/00 |
| KR | 10-0593943 B1 | 6/2006 | H01L 33/00 |
| KR | 10-0616692 B1 | 8/2006 | H01L 33/00 |
| KR | 100714749 B1 | 4/2007 | H01L 33/00 |
| KR | 100741516 | 7/2007 | H01L 33/00 |
| KR | 100759016 B1 | 9/2007 | H01L 33/00 |
| KR | 1020070106624 | 11/2007 | H01L 33/00 |
| KR | 1020090006790 | 1/2009 | H01L 33/00 |
| KR | 1020090117004 | 11/2009 | H01L 23/12 |
| KR | 1020090119862 | 11/2009 | H01L 33/00 |
| KR | 1020100016737 | 2/2010 | H01L 33/48 |
| KR | 1020110011537 | 2/2011 | H01L 23/36 |
| KR | 10-2011-0115506 | 10/2011 | |
| KR | 10-1086014 B1 | 11/2011 | H01L 33/64 |
| KR | 1020130066106 A | 6/2013 | H01L 33/48 |
| KR | 10-1306247 | 9/2013 | |
| WO | WO 02/01633 A1 | 1/2002 | H01L 23/10 |
| WO | WO 02/45463 A2 | 6/2002 | H04R 19/00 |
| WO | WO 2005/086532 A2 | 9/2005 | H04R 19/00 |
| WO | WO 2005/102911 A1 | 11/2005 | B81B 7/00 |
| WO | WO 2006/028312 | 3/2006 | H01L 33/00 |
| WO | WO 2006/061792 A2 | 6/2006 | |
| WO | WO 2007/117198 A1 | 10/2007 | B81B 7/02 |
| WO | WO 2008/091837 A2 | 7/2008 | H01L 27/15 |

(56) References Cited

FOREIGN PATENT DOCUMENTS

| WO | WO 2011/113073 A1 | 9/2011 | ............... H05K 3/00 |
| WO | WO 2011/127503 A1 | 10/2011 | ............... H05K 1/18 |

OTHER PUBLICATIONS

Machine translation of KR 10-2011-0115506.*
Korean Intellectual Property Office, Office Action—Korean Patent Application No. 10-2013-0129171, dated Sep. 24, 2014, 4 pages.
Korean Patent Office, Notification of Grounds for Rejection dated Jan. 28, 2015 pertaining to Application No. 10-2013-0129287, 5 pages.
Korean Patent Office, Notification of Grounds for Rejection dated Jan. 28, 2015 pertaining to Application No. 10-2013-0129287, 4 pages, (*English Translation*).
Kopola et al., *MEMS Sensor Packaging Using LTCC Substrate Technology*, Proceedings of SPIE, vol. 4592, 2001, pp. 148-158.
Mahajan et al., *Emerging Directions for Packaging Technologies*, Intel Technology Journal, vol. 6, Issue 2, May 16, 2002, 16 pages.
Prismark Partners LLC, *Technology Forecast and Impact Analysis of PCB Embedded Components*, Prismark Discovery Series, Mar. 2007, 16 pages.
Towle et al., *Bumpless Build-Up Layer Packaging*, Proceedings ASME Int. Mech. Eng. Congress and Exposition (IMECE) New York, Nov. 11-16, 2001, 7 pages.
Wolffenbuttel, *Microsystems for Multi-Sensory Data-Acquisition*, IEEE International Symposium on Industrial Electronics, 1997, pp. 146-151.

\* cited by examiner

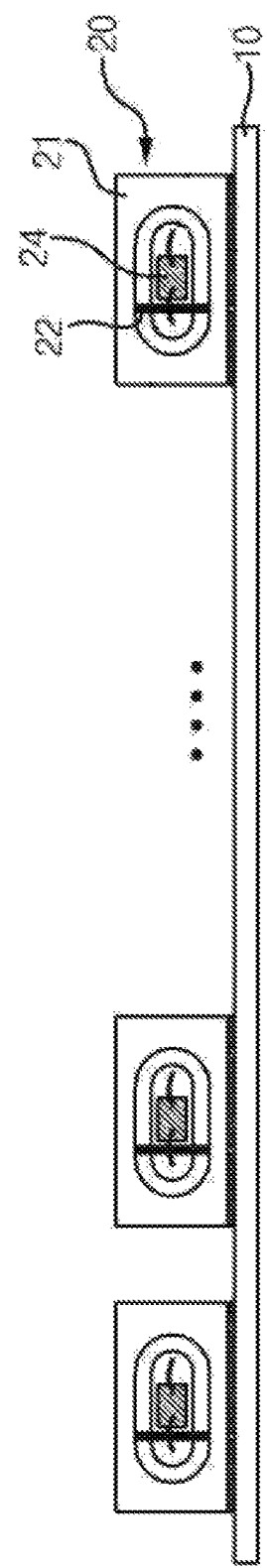

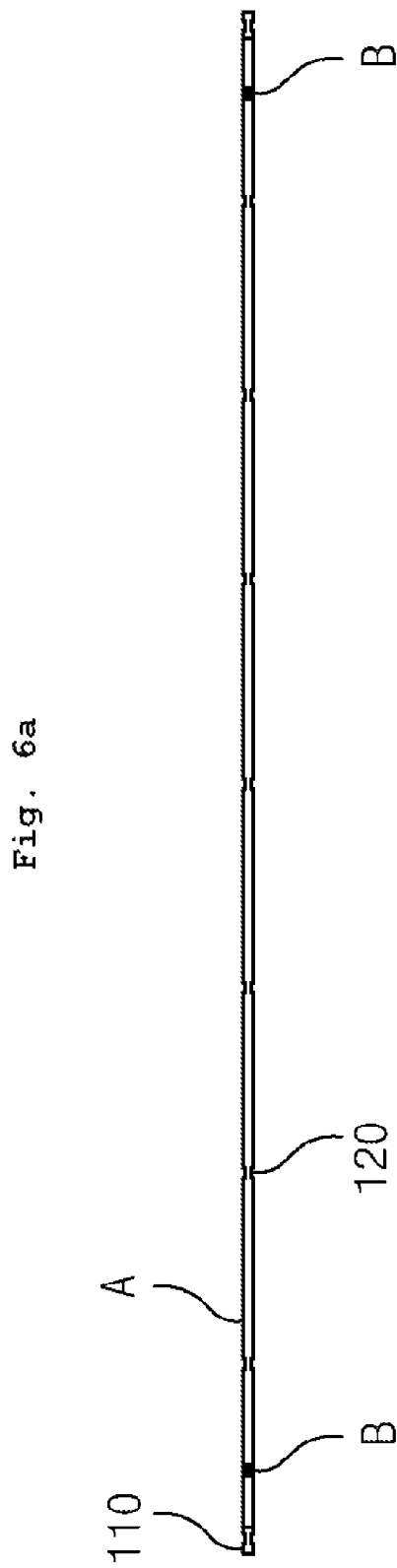

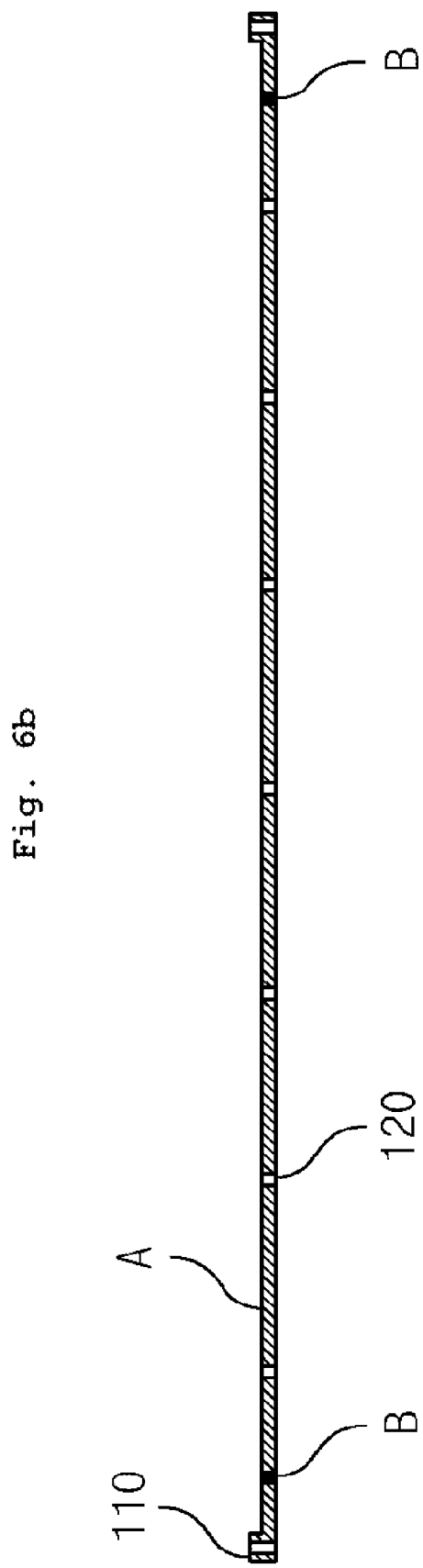

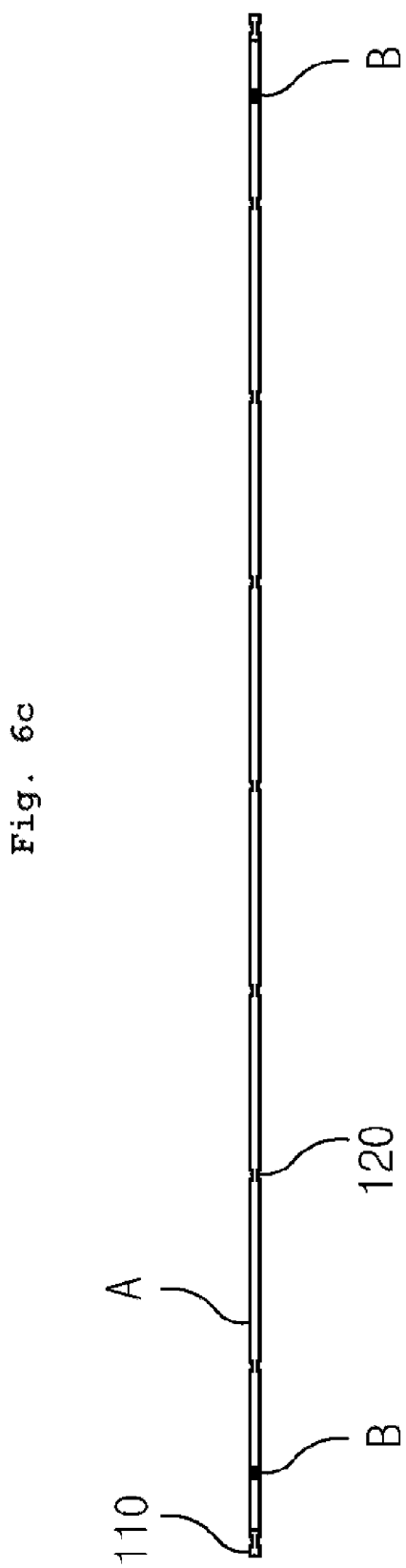

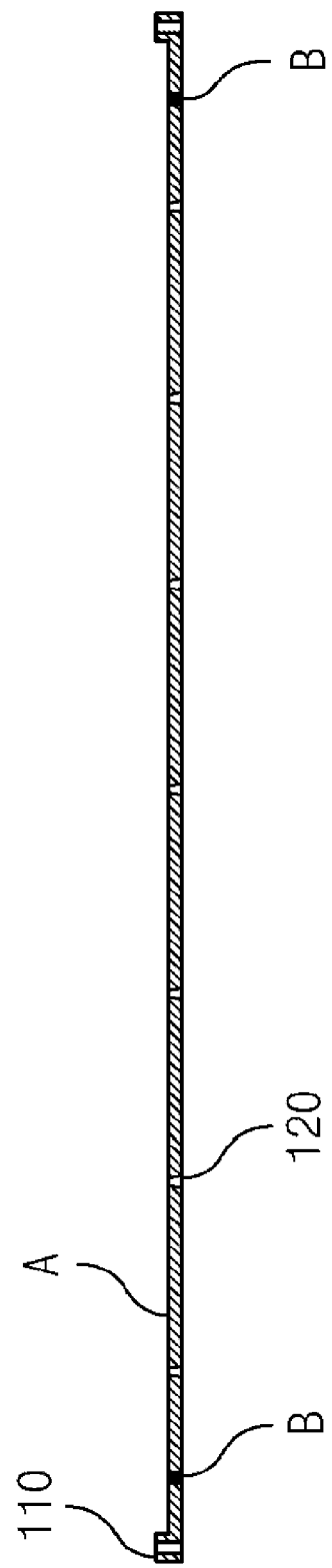

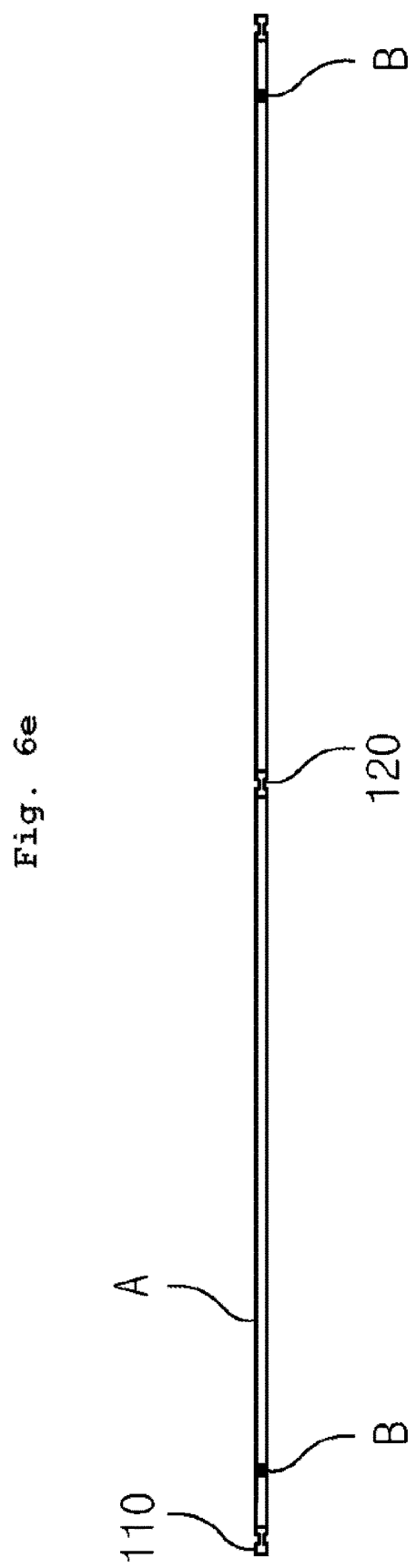

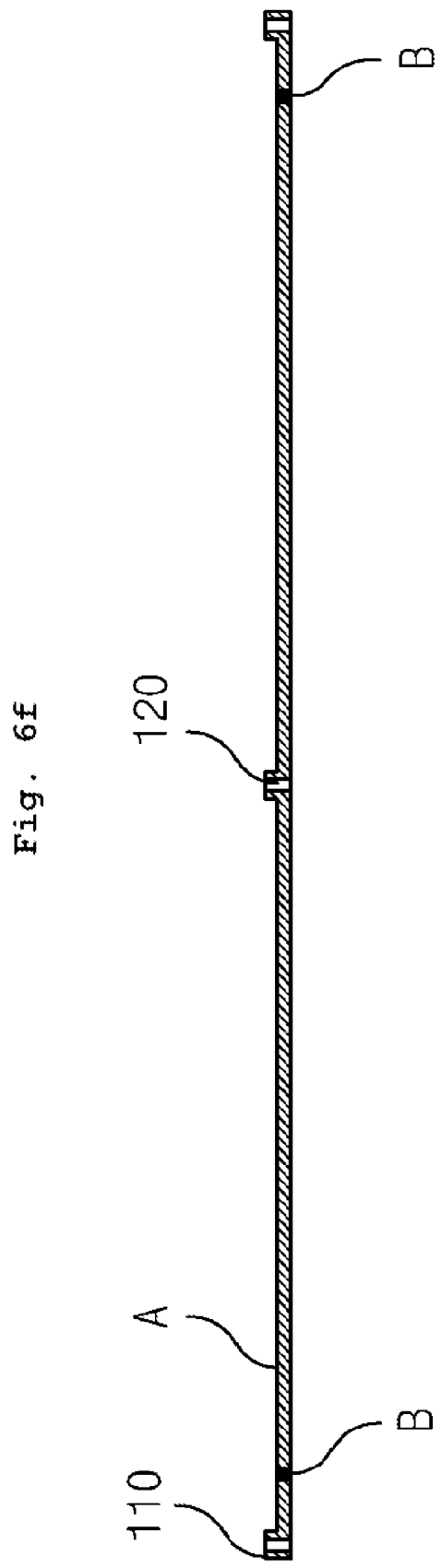

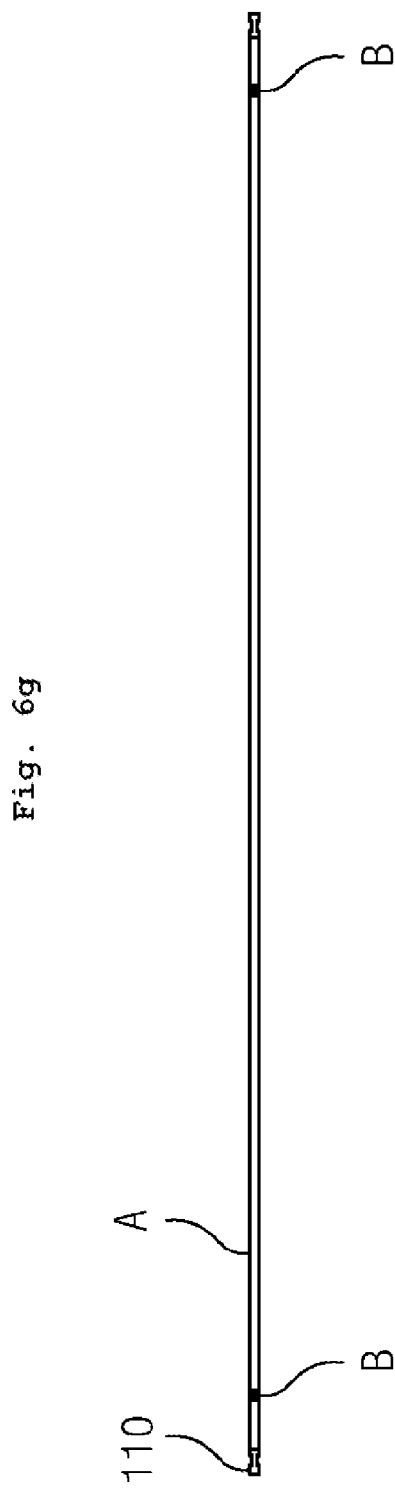

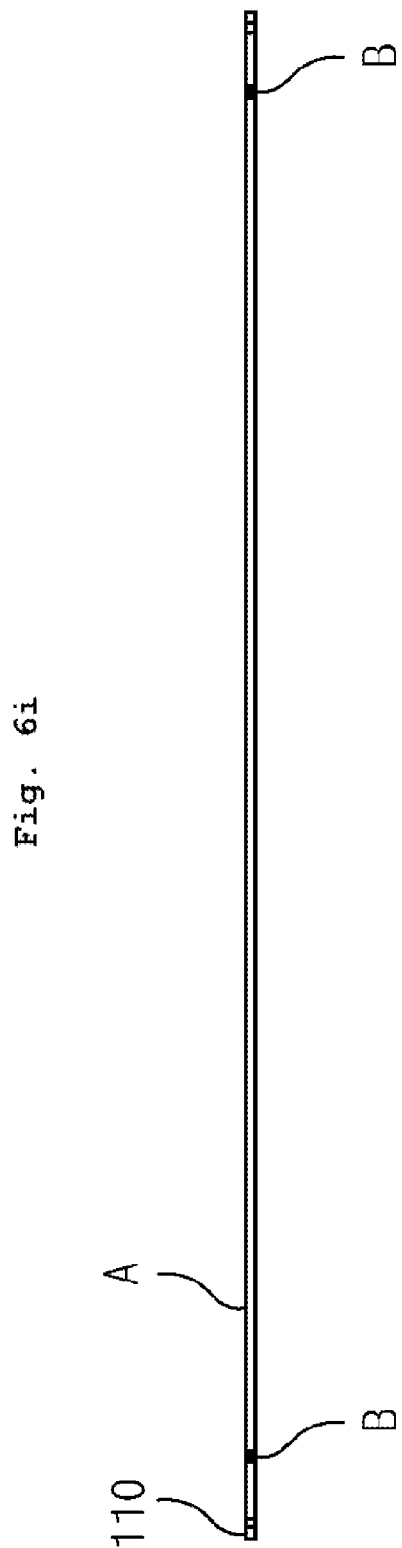

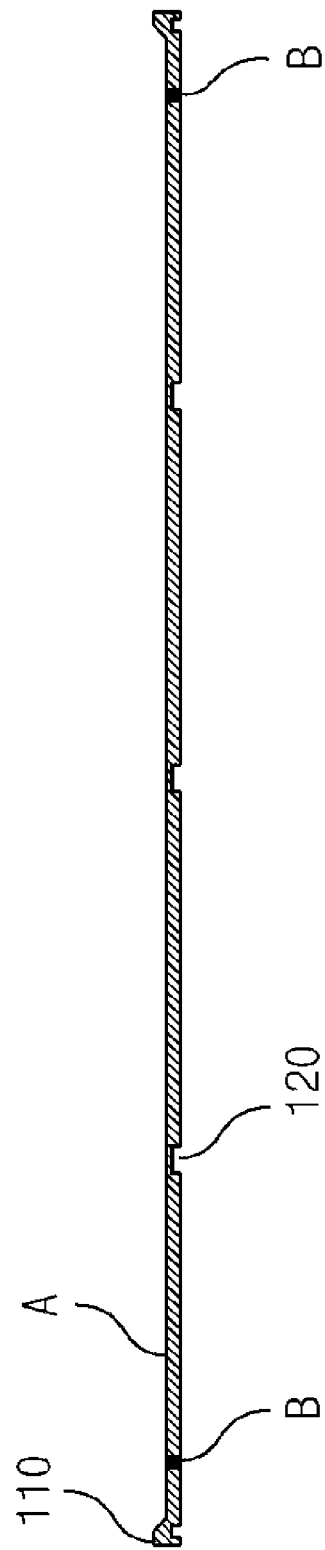

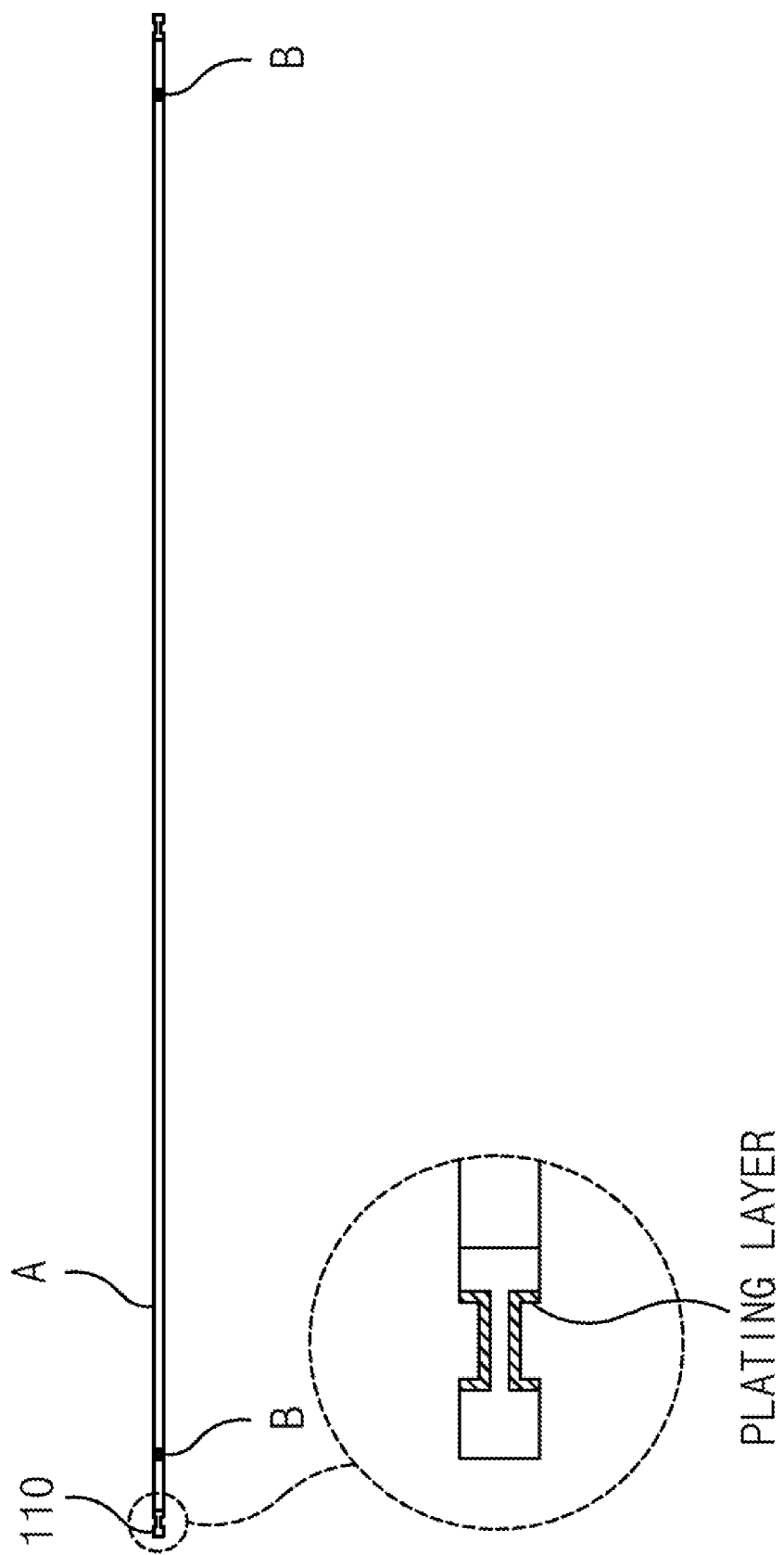

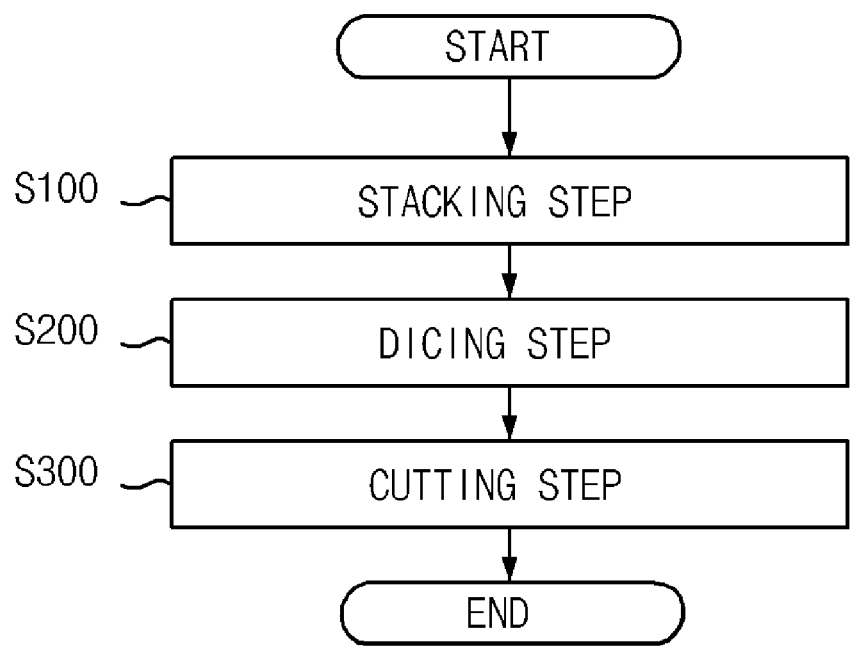

ARRAY SUBSTRATE FOR MOUNTING CHIP AND METHOD FOR MANUFACTURING THE SAME

BACKGROUND

1. Technical Field

The present invention relates to an array substrate for mounting a chip and a method of the same, and more particularly, to an array substrate for mounting a chip in which an optical device chip is mounted.

2. Description of the Related Art

As well known, a liquid crystal display (LCD) device is widely used in a flat panel display unit such as a television, or a computer monitor and the like, and a back light unit (BLU) is an illumination part of emitting light in the back of the LCD device.

Accordingly, the BLU includes a light guide panel for guiding the light incident from the side surface to the front, and a light emitting diode (LED) array is recently used as a side line source of light in the light guide panel. However, according to a conventional optical device array, when manufacturing a module by combining each of LED packages in an array form, the LED packages have to be classified and packaged in order to minimize color deviation of the LED packages. However, there is a difficulty in a process when classifying and packaging the LED packages divided into each LED package.

SUMMARY

The present invention is directed to manufacture an optical device array using an optical device array of a single structure as a line source of light. More particularly, the present invention is directed to an array substrate for manufacturing an optical device array.

In accordance with one aspect of the present invention for achieving the above technical objective, an array substrate for mounting a chip, includes: a plurality of conductive layers unidirectionally stacked with respect to an original chip substrate; a plurality of insulating layers alternately stacked with the plurality of conductive layers to electrically separate the plurality of conductive layers; and a cavity including a groove having a predetermined depth with respect to a region including the plurality of insulating layers at an upper surface of the original chip substrate.

At least one conductive layer among the plurality of conductive layers may further include a concave part.

The array substrate for mounting the chip may further include a plating layer formed on a surface of the concave part.

The array substrate for mounting the chip may further include a plurality of optical devices wherein the insulating layers are arranged between the optical devices in the cavity mounted on the original chip substrate.

The optical devices may be bonded to one of the conductive layers separated by the insulating layers in the cavity.

One electrode of each optical device may be electrically connected to another of the plurality of conductive layers to which no optical device is bonded.

In accordance with another aspect of the present invention for achieving the above technical objective, a method of manufacturing an array substrate for mounting a chip, includes: alternately stacking a plurality of conductive layers and one or more insulating layers for electrically separating the plurality of conductive layers in one direction with respect to an original chip substrate; forming a cavity having a groove of a predetermined depth with respect to a region including the insulating layers at an upper surface of the original chip substrate; and mounting a plurality of optical devices wherein the insulating layers are arranged between the optical devices in the cavity on the original chip substrate.

It is preferable that, in the mounting of the plurality of optical devices, the optical devices are bonded to one of the conductive layers separated by the insulating layers in the cavity.

It is preferable that, in the mounting of the plurality of optical devices, one electrode of each optical device is electrically connected to another of the conductive layers to which no optical device is bonded.

In accordance with still another aspect of the present invention for achieving the above technical objective, an array substrate for mounting a chip includes: a plurality of conductive parts; and one or more insulating parts for electrically separating the plurality of conductive parts, wherein each of the conductive parts located at both ends of the plurality of conductive parts further comprises a protrusion part whose height is different from that of a surface of the conductive parts whereon the chip is mounted.

Preferably, at least one conductive part among the conductive parts includes a concave part for soldering the array substrate for mounting the chips and the circuit board.

Preferably, the concave part is formed inwardly with respect to a surface area where the array substrate is soldered with the circuit board. Preferably, the concave part extends from a surface of the conductive part whereon the chip is mounted to a back surface of the surface, and a width of the concave part is getting wider as it travels towards the back surface.

Preferably, the concave part is formed inwardly with respect to a back surface of the surface whereon the chip is mounted.

The array substrate for mounting the chip may further include a plating layer formed on a surface of the concave part.

Preferably, the protrusion part may include an inclined surface extending to and having a predetermined angle with respect to a surface of the conductive part.

In accordance with yet another aspect of the present invention for achieving the above technical objectives, an array substrate for mounting a chip includes: a plurality of conductive parts arranged in one direction, whereon a plurality of chips are mounted in the direction; and a plurality of insulating parts alternately arranged with the plurality of conductive parts for electrically separating the plurality of conductive parts, wherein each of the conductive parts located at both ends of the plurality of conductive parts further comprises a protrusion part whose height is different from that of a surface of the conductive parts whereon the chip is mounted.

In accordance with yet another aspect of the present invention for achieving the above technical objectives, a method of manufacturing an array substrate for mounting a chip includes: alternately stacking a plurality of conductive layers and one or more insulating layers for electrically separating the plurality of conductive layers in one direction with respect to an original chip substrate; forming a chip mounting surface reaching a predetermined depth with respect to a region including the insulating layers at an upper surface of the original chip substrate; and cutting the original chip substrate along a predetermined cutting plane.

When manufacturing a line source of light using an array substrate for mounting a chip according to the present invention, the color coordinate deviation of a light source for a back light unit can be minimized and the process can be further simplified. Further, since the optical device array of a single structure is used as a line source of light, an emission angle emitted from the optical device is great, it is not necessary to form an interval for supplying an amount of light, and a display device can be simply constructed. Further, since it is not necessary to perform soldering a plurality of LED packages on a printed circuit board, a thickness of the back light unit can be reduced.

BRIEF DESCRIPTION OF DRAWINGS

FIGS. 1a and 1b are a front view and a plan view of a conventional light emitting diode (LED) array, respectively.

FIGS. 6a and 6b are a top view and a side view of an array substrate for mounting a chip according to another embodiment of the present invention, respectively.

FIGS. 6c and 6d are a top view and a side view of an array substrate for mounting a chip according to another embodiment of the present invention, respectively.

FIGS. 6e and 6f are a top view and a side view of an array substrate for mounting a chip according to another embodiment of the present invention, respectively.

FIGS. 6g and 6h are a top view and a side view of an array substrate for mounting a chip according to another embodiment of the present invention, respectively.

FIGS. 6i and 6j are a top view and a side view of an array substrate for mounting a chip according to another embodiment of the present invention, respectively.

FIG. 6k presents a partial enlarged view of the array substrate shown in FIG. 6g.

FIG. 7 is a flowchart for describing a method of manufacturing an array substrate for mounting a chip according to another embodiment of the present invention.

DETAILED DESCRIPTION OF EMBODIMENTS

The following description is illustrative of the principles of the invention. Although not clearly described and not shown in this specification, those of ordinary skill in the art may implement principles of the present invention and invent various devices included in the scope and spirit of the present invention. Further, all conditional terms and exemplary embodiments clearly described in this specification are intended only for the purpose of allowing the spirit of the present invention to be understood, and it should be understood that the present invention is not limited to the exemplary embodiments and states which are specially described herein.

The above-described objects, features, and advantages will be more apparent from the accompanying drawings and the following description, and those of ordinary skill in the art may embody and practice the spirit of the present invention.

Further, when it is determined that detailed description of known technology related to the present invention unnecessarily may obscure the gist of the present invention, detailed description thereof will be omitted. Hereinafter, exemplary embodiments of an array substrate for mounting a chip will be described in detail with reference to the accompanying drawings, and for convenience, an example in which the chip is a light emitting diode (LED) chip will be described.

Figure 1B:

Referring to FIGS. 1a and 1b, FIGS. 1a and 1b illustrate a package in which LEDs are mounted, respectively, and are a front view and a plan view of an LED array in which LED packages are combined in an array form.

As shown in FIGS. 1a and 1b, the LED array used as a side line source of light for a back light unit (BLU) may have a plurality of LED packages 20 arranged on a printed circuit board (PCB) 10 having an elongated strip shape and a predetermined interval. As described above, each LED package 20 may be constructed by bonding an LED chip 24 located on an upper surface of an aluminum substrate 21 in which an insulating layer 22 is located between the aluminum substrates 21 by a wire, and the LED chip 24 may be mounted inside a cavity of a groove shape having a predetermined depth from an upper surface of the aluminum substrate 21 in order to improve reflection performance.

According to a conventional optical device array as described above, when manufacturing a module by combining LED packages in an array form as a light source for the BLU, there is a difficulty in a process since the LED packages have to be packaged by classifying in order to minimize color deviation of the LED packages.

First Embodiment

Figure 2A:
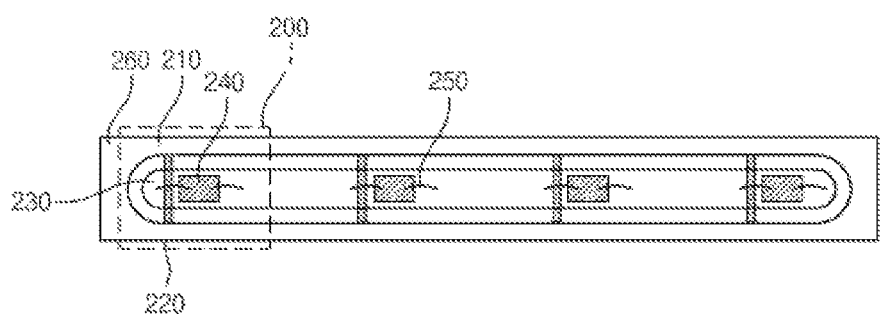
FIGS. 2a and 2b are a top view and a side view of an array substrate for mounting a chip according to an embodiment of the present invention, respectively.
Figure 2B:
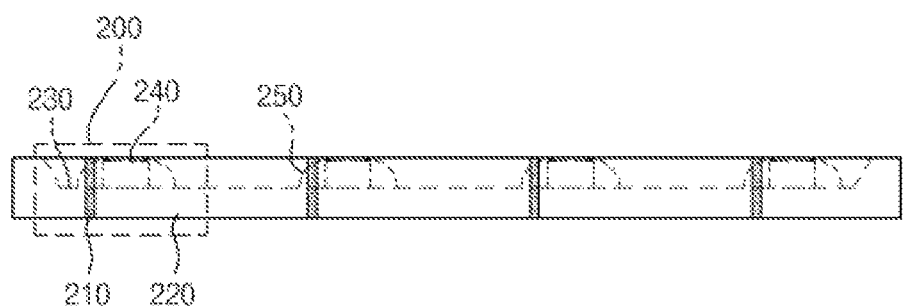
Figure 5:
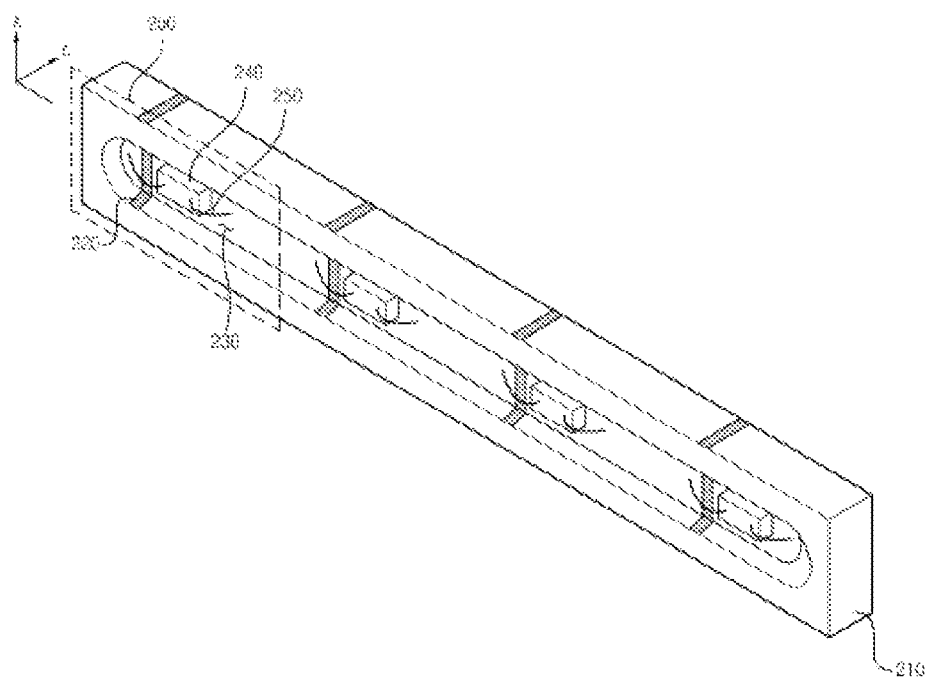
FIG. 5 is a perspective view of an array substrate for mounting a chip according to an embodiment of the present invention.

Hereinafter, an array substrate for mounting a chip according to an embodiment of the present invention will be described with reference to FIGS. 2a, 2b, and 5. FIGS. 2a and 2b are a top view and a side view of an array substrate for mounting a chip according to an embodiment of the present invention, respectively, and FIG. 5 is a perspective view. As shown in FIGS. 2a, 2b, and 5, an LED array for the BLU may include a plurality of unit LED chips 200 which are arranged as a single structure.

The LED array for the BLU according to an embodiment of the present invention may include conductive layers 210, insulating layers 220, a cavity 230, and LEDs 240 which are the optical devices.

The conductive layers 210 may be stacked in one direction with respect to an original chip substrate, and the insulating layers 220 may be alternately stacked with the conductive layers 210, and electrically separate the conductive layers 210.

Also, in this embodiment, the cavity 230 may be a groove having a predetermined depth in a region including a plurality of the insulating layers 220 on an upper side of the original chip substrate. Further, the optical devices 240 may be mounted on the original chip substrate in the cavity 230 in which the insulating layer 220 is arranged between the optical devices 240.

Actually, in this embodiment, each unit LED chip 200 may not be separated, an array substrate for mounting every LED chips may be formed by mounting a plurality of optical devices on one chip original substrate, and the unit LED chip 200 may be defined by dividing the original chip substrate in units of a virtual region.

As described above, the insulating layer 220 may be arranged between the unit LED chips 200, each unit LED chip 200 may be formed by bonding the optical device 240 to the conductive layer 210 using a bonding wire 250, and the optical device 240 may be mounted in the cavity 230 formed to have a predetermined depth from an upper surface of a chip substrate including the conductive layer 210 and the insulating layer 220, for example, in the cavity 230 formed to have a wide upper portion and a narrow lower portion in order to improve reflection performance.

That is, in this embodiment, the optical device 240 may be bonded to anyone among the conductive layers 210 separated by the insulating layers 220 in the cavity 230, and an electrode may be electrically connected to another conductive layer 210 in which the optical device 240 is not boned among the conductive layers 210. Further, in this embodiment, a bonding position or a wire bonding method of the optical device 240 may be varied according to its structure.

In this case, the conductive layers 210 in which the insulating layer 220 is interposed by penetrating a body may be used as positive (+) and negative (−) electrode terminals, respectively. In the drawing, reference numeral 300 (not shown) may represent a soldering layer for mounting the optical device 240.

As shown in FIGS. 2a and 2b, according to the array substrate for mounting the chip according to an embodiment of the present invention, since the unit LED chip 200 may be mounted on a display unit as the BLU in a state of lying sideways, light from each unit LED chip 200 may be emitted forward. In addition, when emitting light forward, the LED array according to an embodiment of the present invention may construct an optical device array to be used as a line source of light by mounting the plurality of optical devices on the original chip substrate as a single structure without constructing the optical device array by soldering a plurality of optical device chips on a printed circuit board.

Further, in the array substrate for mounting the chip according to an embodiment of the present invention of FIG. 2a, a solder resist, preferably, a white solder resist 260 having excellent light reflection performance, may be coated on an upper surface of the array substrate. Accordingly, the chip substrate may be prevented from being contaminated and insulating performance may be prevented from being degraded due to climbing of a solder paste. Meanwhile, waste of a plating material can be reduced, and light reflection performance may be improved through a secondary reflection.

Moreover, in this embodiment, at least one among conductive layers of the array substrate for mounting the chip may further include a concave part for soldering the array substrate for mounting the chip and the circuit board, and may further include a plating layer formed on a surface of the concave part.

That is, in this exemplary embodiment of the present invention, the concave part is formed inwardly with respect to the surface where the array substrate for mounting chips is soldered with the circuit board, and the concave part, more particularly, the surface of the concave part for plating is applied with a solder paste such that the optical device is being soldered to the printed circuit board in a state of lying sideways in order to face front.

Hereinafter, a method of manufacturing an array substrate for mounting a chip according to an embodiment of the present invention will be described with reference to FIG. 3.

Figure 3:
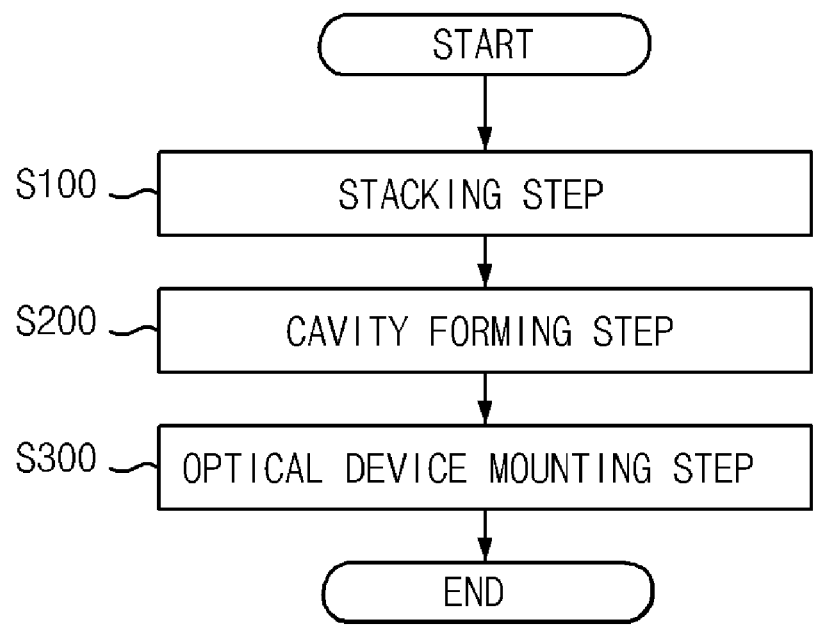
FIG. 3 is a flowchart for describing a method of manufacturing an array substrate for mounting a chip according to an embodiment of the present invention.

FIG. 3 is a flowchart for describing a method of manufacturing an array substrate for mounting a chip according to an embodiment of the present invention, and FIGS. 4a to 4e are diagrams illustrating a step of manufacturing an optical device substrate having an insulating layer.

Referring to FIG. 3, a method of manufacturing an array substrate for mounting a chip according to an embodiment of the present invention may include a stacking operation (S100), a cavity forming step (S200), and an optical device mounting step (S300).

As shown in FIG. 3, according to the method of manufacturing the array substrate for mounting the chip, first, the stacking step (S100) may be a step of manufacturing an original chip substrate having a plurality of insulating layers, and may alternately stack a plurality of conductive layers and one or more insulating layers for electrically separating the plurality of conductive layers in one direction with respect to the original chip substrate.

Figure 4A:
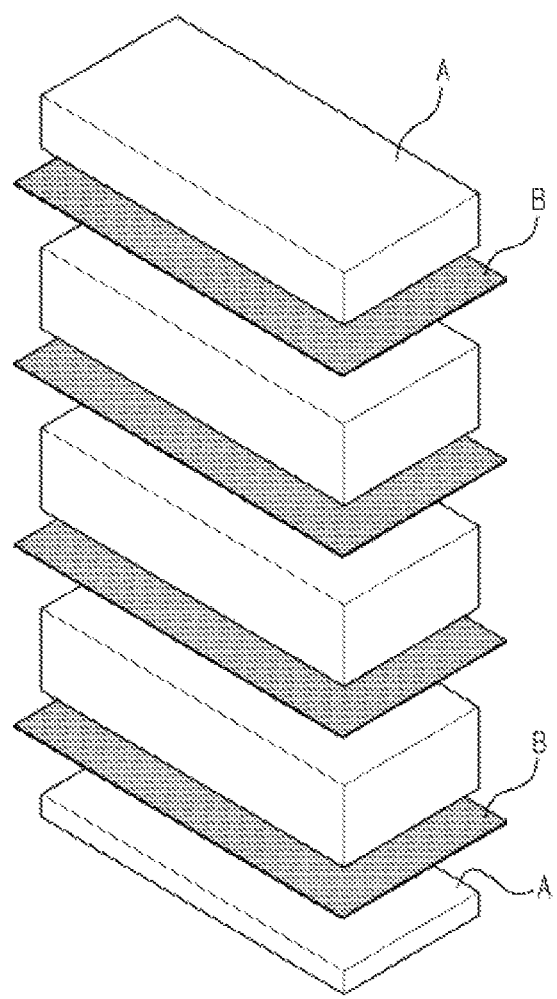
FIGS. 4a to 4e are diagrams illustrating a step of manufacturing an optical device substrate having a vertical insulating layer.
Figure 4B:
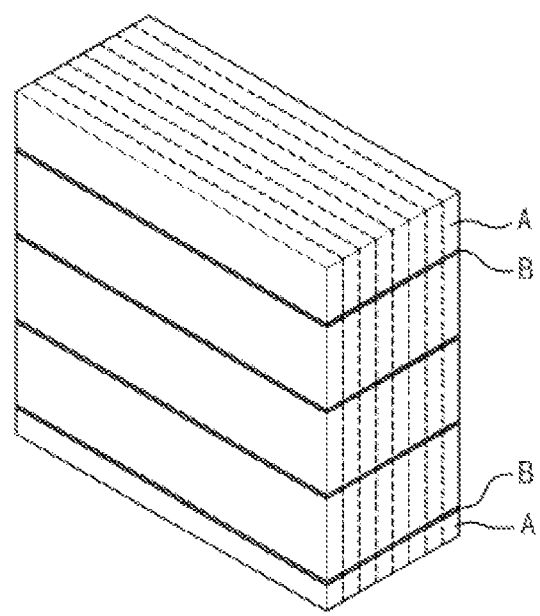

Regarding this, a lump of aluminum in which a plurality of insulating layers B are arranged inside with an interval may be manufactured as shown in FIG. 4b by heating and pressurizing a plurality of aluminum panels A having a predetermined thickness in a state of being stacked by bonding the plurality of aluminum panels A in which an insulating film B is arranged between the aluminum panels A as shown in FIG. 4a. Further, in this embodiment, the plurality of aluminum panels may be bonded using a bonding material after anodizing an aluminum panel in order to improve bonding performance of aluminum.

Figure 4C:
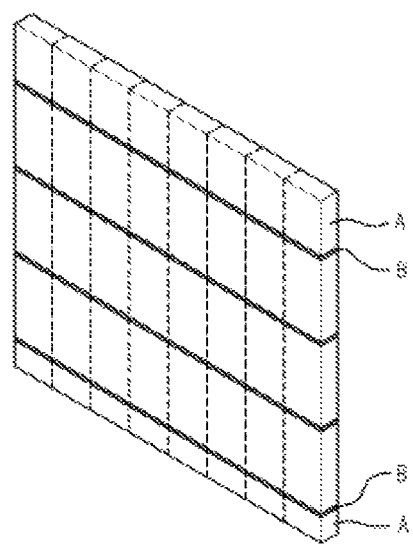

Next, the original chip substrate in which the plurality of insulating layers B are arranged in parallel with an interval may be manufactured as shown in FIG. 4c by cutting the manufactured lump of aluminum in a vertical direction, for example, by a wire sawing method, to include the insulating layer B as shown in dotted lines in FIG. 4b. In FIG. 4c, the dotted lines represent cutting lines for forming each of optical device arrays.

Next, the cavity forming step (S200) may form the cavity including a groove having a predetermined depth with respect to a region including the insulating layer on an upper surface of the original chip substrate.

Figure 4D:
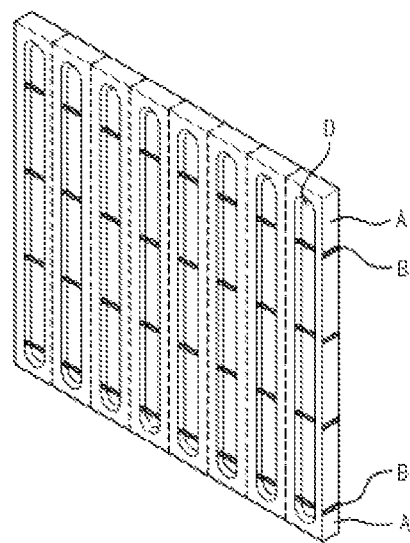

That is, as shown in FIG. 4d, a cavity D having a predetermined depth from the upper surface of the chip substrate in each chip substrate region may be formed, for example, by a cutting process and the like. In this case, the insulating layer B may have to penetrate a bottom surface of the cavity D. The cavity D may be desirable to have a shape of a wide upper portion and a narrow lower portion.

Further, although not shown, prior to the cavity forming step (S200) or subsequent to the cavity forming step (S200), a step of forming a soldering part for soldering the array substrate for mounting the chip according to an embodiment of the present invention to the printed circuit board by forming a plurality of through-holes in which an insulating layer is arranged between the through-holes from the upper surface to a back surface of the original chip substrate in a state of the original chip substrate, or forming a concave groove having a predetermined depth from the back surface of the original chip substrate may be further included.

Further, the soldering part according to an embodiment of the present invention may be used for soldering and as an electrode part for applying a polarity to the chip mounted according to a structure of the array substrate, and the function of each element according to an embodiment of the present invention is not limited to only the embodiment of the present invention, and various functions may be performed according to a chip mounting method, or circuit construction of the printed circuit board in which the substrate is bonded.

Moreover, after forming the soldering part, as described above, a step of forming a plating layer on a surface of the soldering part may be further included, and the plating layer may be further formed so that the array substrate for mounting the chip is certainly soldered on the printed circuit board.

Figure 4E:
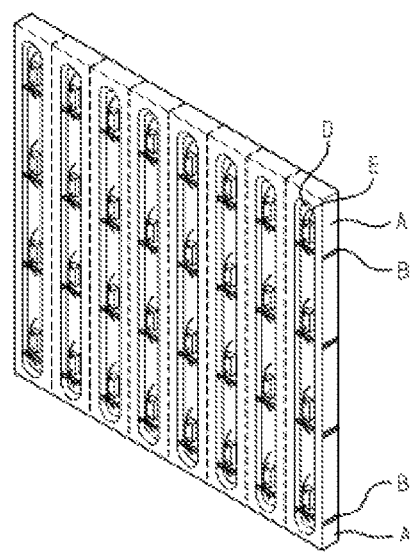

Next, the optical device mounting step (S300) may mount the plurality of optical devices in which an insulating layer is arranged between the optical devices in the cavity of the original chip substrate. That is, as shown in FIG. 4e, optical devices E may be bonded using a wire after mounting the optical devices E in each cavity D in the state of the original chip substrate.

In this embodiment, in the optical device mounting step (S300) an optical device is bonded to any one among the conductive layers separated by the insulating layer in the cavity, and one electrode of the optical device is electrically connected to another conductive layer in which the optical device is not bonded among the conductive layers.

Next, the original chip substrate may be cut along cutting lines C in the cutting step, and thus each optical device array may be manufactured as shown in FIG. 5. The cutting step may be performed in a state that a lower portion of the original chip substrate is fixed by an adhesive tape and the like.

Second Embodiment

Hereinafter, with reference to FIGS. 6a and 6b, an array substrate for mounting a chip according to another embodiment of the present invention will be described. FIGS. 6a and 6b are a top view and a side view of an array substrate for mounting a chip, respectively. As shown in FIGS. 6a and 6b, the array substrate for mounting the chip according to another embodiment of the present invention may include conductive part A, insulating parts B, protrusion part 110, and concave parts 120.

In this embodiment, the conductive part A may be unidirectionally arranged, and a plurality of chips may be mounted according to the arrangement direction. Being unidirectionally arranged means being arranged in a single direction on the completed original substrate. Further, since the chips are mounted on the surface of the conductive part A, the chips may be also mounted along the arrangement direction of the conductive part A.

The insulating parts B may be alternately stacked and electrically separate the conductive part A. That is, the insulating parts B may separate electrodes of the conductive part A, and thus another electrode may be applied to the mounted chips. Since the insulating part B has a smaller thickness than the conductive part A, an insulating film may be used as the insulating part B.

In this embodiment, the chips mounted on the conductive part A may be directly bonded to the conductive part A, or be in contact with the conductive part A using a wire bonding process and the like according to a shape of the chip.

Further, the insulating part B of the array substrate according to another embodiment of the present invention may be variously configured according to the shape of the chip.

With reference to FIGS. 6a and 6b, in this embodiment, two insulating parts B are constructed, a positive (+) polarity may be applied to the conductive part A separated by one insulating part B, and a negative (−) polarity may be applied to the conductive part A separated by another insulating part B. Further, the polarities may be applied to the chips mounted on the conductive part A in which the electrodes are not applied, by electrically connecting the chips mounted on the conductive part A in which the electrodes are not applied and the chips mounted on the conductive part A in which the electrodes are applied using a wire bonding process and the like between the chips.

In another embodiment, the number of insulating parts B may be arranged corresponding to the number of chips, and the chips are mounted on each of the conductive part A separated by the insulating part B. In this embodiment, different polarities may be applied to the conductive part A separated by and adjacent to the insulating part B, and the electrodes may be applied by constructing a structure which is in contact with the conductive part A which is directly adjacent to the bonding wire or the chip.

Moreover, in this embodiment, the conductive part A which are located in both ends among the plurality of conductive part A may include the protrusion part 110 formed to have a difference in a height with surfaces of the conductive part A in which the chips are mounted That is, referring to FIG. 6b, in this embodiment, the conductive part A of the both ends may further include the protrusion part 110 having a higher surface than the conductive part A. The protrusion part 110 may perform a function of preventing an encapsulant from leaking when injecting the encapsulant for encapsulating after mounting the chip on the substrate.

Further, referring to FIGS. 6i and 6j, in this embodiment, the protrusion part 110 may further include an inclined surface having a predetermined angle continued with the surfaces of the conductive part A. That is, in FIG. 6b, the protrusion part 110 may have a shape of protruding from the surface of the conductive part A, or in FIGS. 6i and 6j, the protrusion part 110 may be formed to be continued with the surface of the conductive part A by slantly arranging one surface of the protrusion part 110. In this case, the inclined surface of the protrusion part 110 may perform a function as a reflector of reflecting light emitted from an LED chip when the LED chip is mounted.

Accordingly, in this embodiment, preferably, the inclined angle of the inclined surface may be determined to satisfy both the function of preventing the encapsulant from leaking and the function as the reflector.

Further, referring to FIGS. 6e and 6f, in this embodiment, the protrusion part 110 may be also formed with respect to the conductive part A arranged in a center portion of the substrate besides the conductive part A arranged on both ends. The encapsulant may be further prevented from leaking by properly arranging the protrusion part 110 according to a length of the substrate.

Moreover, in this embodiment, at least one conductive part A among the conductive parts A may include the concave part 120 for soldering the array substrate for mounting the chip and the printed circuit board.

In this embodiment, the array substrate is provided with an electrode, and emits light to the BLU or performs a function according to the mounted chip by soldering with the printed circuit board after the chip is mounted.

Accordingly, in this embodiment, when a material of the conductive part A for soldering the conductive part A of the array substrate and the printed circuit board is not soldered well, the concave part 120 may be further included in the conductive part A in order to coat a solder paste or secure a soldering dimension.

That is, referring to FIGS. 6a and 6b, the array substrate according to another embodiment of the present invention may be formed to have the concave part 120 with respect to regions including the protrusion part 110 of the conductive part A located in both ends among the arranged conductive part A, and to have a plurality of concave parts 120 with respect to the center portion of the conductive part A.

That is, in this exemplary embodiment of the present invention, the array substrate is formed inwardly with respect to the surface where the array substrate for mounting chips is soldered with the circuit board, and accordingly, in this case, the optical device is being soldered to the printed circuit board in a state of lying sideways in order to face front. A shape of the concave part 120 may have a shape for increasing a soldering surface dimension, in this embodiment, the shape may have an arc shape, but according to necessity, may have a quadrangular shape or a triangular shape and the like.

Further, in this embodiment, the concave parts 120 of the arc shapes may be formed along the cutting line in the cutting step for manufacturing the array substrate according to another embodiment of the present invention with respect to the original chip substrate which will be described later. That is, when the original chip substrate is cut in order to manufacture the array substrate after making a hole using a drilling process and the like at one position on the cutting line for cutting, the concave parts 120 having the arc shapes may be formed as shown in FIGS. 6a and 6b.

Moreover, referring to FIG. 6d, in this embodiment, the concave part 120 may be formed from the surface of the conductive part A in which the chip is mounted to the back surface of the surface, and the width of the concave part 120 becomes wider as it travels towards the back surface. That is, the concave part 120 in the array substrate for mounting the chip in FIGS. 6a and 6b has a uniform width with respect to the surface, in which the chip is mounted, and the back surface, but in FIGS. 6c and 6d, the width becomes wider as it travels towards the back surface.

That is, when encapsulating the surface of the chip with the encapsulant after mounting the chip, the concave part 120 may have a narrow width with respect to the surface in order to prevent the encapsulant from leaking to the generated concave part 120.

As shown in FIGS. 6e and 6f, the protrusion part 110 may be further arranged in the center portion of the array substrate, and may prevent the encapsulant from leaking to the concave part 120 by arranging the concave parts 120 only in the regions including the protrusion part 110 of the both ends and the center portion.

Figure 6H:
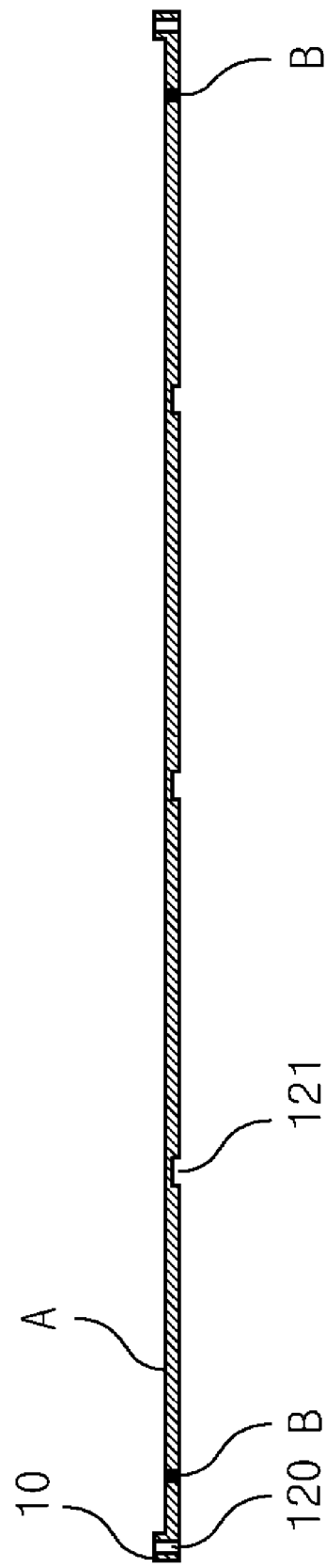

Further, referring to FIGS. 6g and 6h, in this embodiment, the concave part 121 may be formed inwardly with respect to the back surface of the surface of the conductive part A in which the chip is mounted.

That is, referring to FIGS. 6a and 6b, the concave part 120 may be formed from the surface to the back surface, but may be formed as a groove having a predetermined depth only with respect to the back surface. The concave part 120 may be formed by making a groove of a straight line shape in the back surface with respect to the original chip substrate before the array substrate is cut. That is, when cutting the original chip substrate after the groove is formed, the concave part 120 for soldering the array substrate of a shape as shown in FIGS. 6g and 6h may be formed.

The concave part 120 according to another embodiment of the present invention may be simply manufactured compared with the drilling process, and the encapsulant may be prevented from leaking since there is no region being in contact with a surface in which the chip is mounted. Further, in this embodiment, a cross section of the concave part 120 may have a quadrangular shape, but may have a triangular shape or other shapes according to a process of making the groove in the state of the original chip substrate described above.

Further, in this embodiment, as shown in FIG. 6k, a plating layer may be further formed on the surface of the concave part 120. That is, in this embodiment, when aluminum is used as a material of the conductive part A, the plating part may be formed on the surface of the concave part 120 in order to perform soldering more securely between the array substrate for mounting the chip and the printed circuit board.

Moreover, the concave part 120 according to another embodiment of the present invention may be described as a part for soldering, but may function as an electrode part for applying an electrode to the mounted chip according to a structure of the array substrate. Also, the function of each element according to the embodiment of the present invention is not limited to only the embodiment of the present invention, and each element may perform various functions according to a method of mounting the chip to be mounted or circuit construction of the printed circuit board in which the substrate is bonded.

Further, the array substrate for mounting the chip according to another embodiment of the present invention may be coated by a solder resist, and preferably, by a white solder resist having excellent light reflectivity performance, on an upper surface. The chip substrate can be prevented from being contaminated and insulating performance can be prevented from being degraded due to the solder paste climbing the chip substrate, and a plating material can be saved, and reflection performance can be improved by a secondary reflection.

When the array substrate according to another embodiment of the present invention is used, as shown in FIGS. 1 and 6, a step of soldering the unit chip substrates in which the plurality of chips are mounted on the printed circuit board in units of a predetermined interval may not be required. When manufacturing the optical device array as the line source of light using the array substrate for mounting the chip, a color coordinate deviation of a light source for the BLU can be minimized, and a manufacturing step can be simplified. Further, since the optical device array of a single structure is used as the line source of light, an emission angle of light emitted from the optical device become large, and it may not be necessary to form an interval for supplying an amount of light. Accordingly, the display device can be simply constructed. Further, since it is not necessary to solder the plurality of LED chips on the printed circuit board, a thickness of the BLU can be decreased.

Hereinafter, a method of manufacturing the array substrate according to another embodiment of the present invention described above will be described.

FIG. 7 is a flowchart for describing a method of manufacturing an array substrate for mounting a chip according to another embodiment of the present invention, and FIGS. 8a to 8e are diagrams illustrating a step of manufacturing an original chip substrate having an insulating part B.

Referring to FIG. 7, a method of manufacturing an array substrate for mounting a chip according to another embodiment of the present invention may include a stacking step (S100), a dicing step (S200), and a cutting step (S300).

As shown in FIG. 7, according to the method of manufacturing an array substrate for mounting a chip according to another embodiment of the present invention, first, the stacking step (S100) may be a step of manufacturing an original chip substrate having a plurality of insulating layers, and may be a step of alternately stacking a plurality of conductive layers and one or more insulating layers for electrically separating the plurality of conductive layers in one direction with respect to the original chip substrate.

Figure 8A:
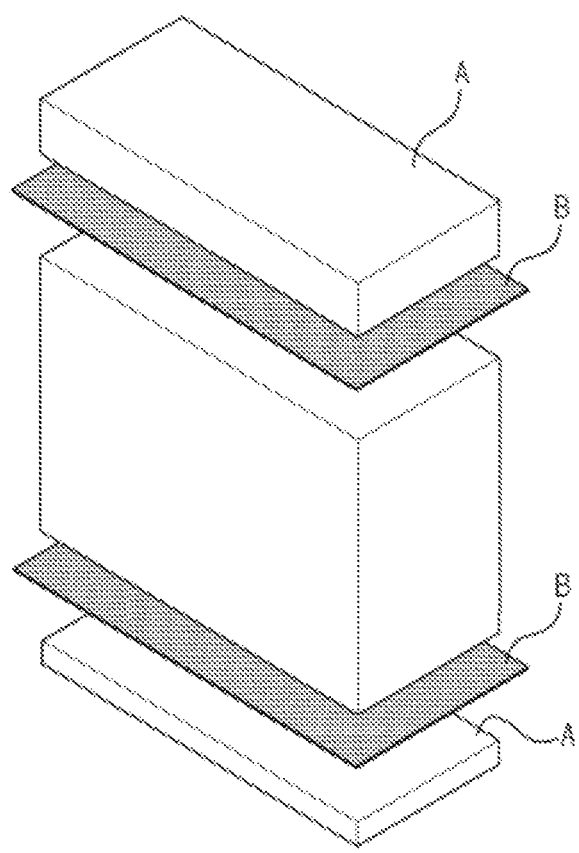
FIGS. 8a to 8e are diagrams illustrating a step of manufacturing an array substrate for mounting a chip.
Figure 8B:
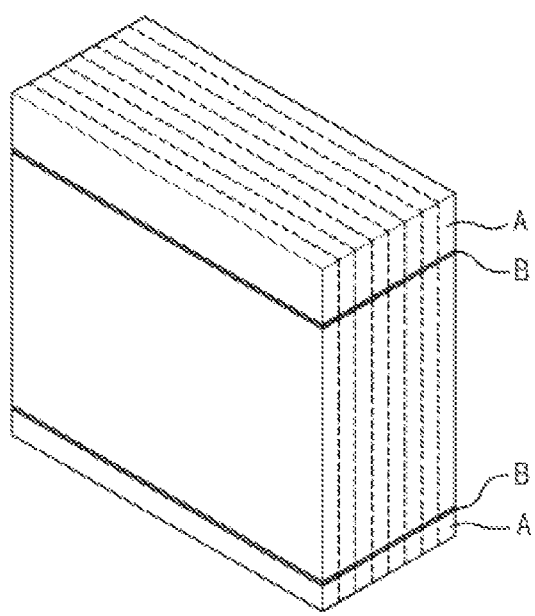
Figure 8C:
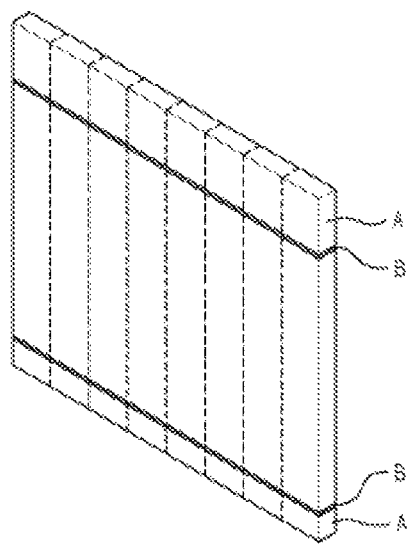

Regarding this, as shown in FIG. 8a, a lump of aluminum in which a plurality of insulating layers B are arranged inside in units of a predetermined interval as shown in FIG. 8b may be manufactured by heating and pressurizing in a state that a plurality of aluminum panels A having a predetermined thickness which are the conductive layers in which an insulating layer is arranged between the conductive layers are bonded and stacked. Next, the original chip substrate in which the plurality of insulating layers B are arranged in parallel in units of the predetermined interval may be manufactured as shown in FIG. 8c by cutting the manufactured lump of aluminum in a vertical direction as shown in dotted lines in FIG. 8b. In FIG. 8c, the dotted lines represent cutting lines for forming each array substrate for mounting the chip.

Next, the dicing step (S200) may cut a surface, in which the chip is mounted, to have a groove of a predetermined depth with respect to a region including the insulating layer on the upper surface of the original chip substrate. The protrusion part described above may be formed with respect to portions which are not diced by the dicing of the surface.

Figure 8D:
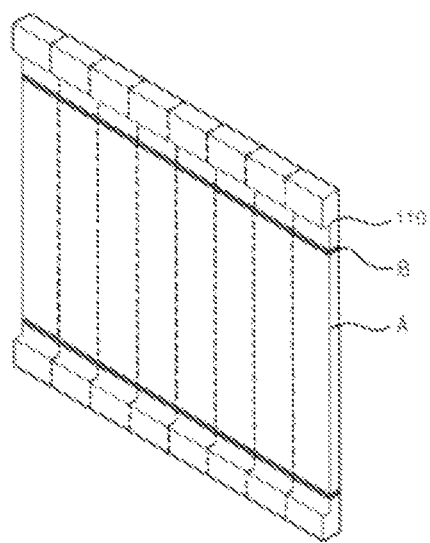
Figure 8E:
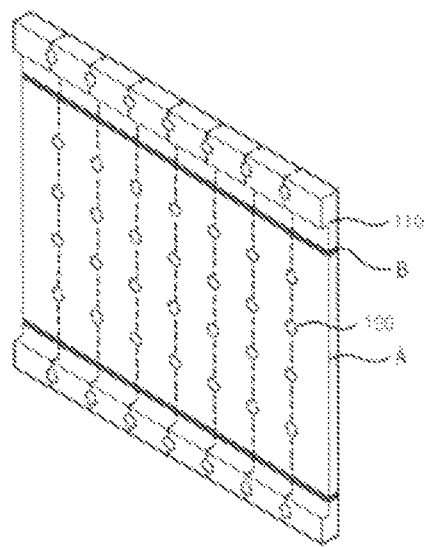

That is, as shown in FIG. 8d, a surface reaching the predetermined depth from the upper surface of the chip substrate in each chip substrate region may be formed, for example, by a dicing process and the like, and in this case, the insulating layer B must cross the surface. Further, the dicing step (S200) may form a soldering part at one position on the cutting line for cutting by making a hole by a drilling process and the like, or making a groove of a straight line shape from the back surface with respect to the original chip substrate before the array substrate is cut.

That is, the soldering part for soldering the array substrate according to another embodiment of the present invention on the printed circuit board may be formed by forming a plurality of through-holes in which the insulating layer is arranged between the through-holes from the upper surface to the back surface, or forming a concave groove of a predetermined depth with respect to the back surface in a state of the original chip substrate.

Further, the soldering part according to another embodiment of the present invention may be used for soldering and as an electrode part for applying a polarity to the chip mounted according to a structure of the array substrate, and the function of each element according to another embodiment of the present invention is not limited to only the embodiment of the present invention, and various functions may be performed according to a chip mounting method, or circuit construction of the printed circuit board in which the substrate is bonded.

Moreover, after forming the soldering part, as described above, a step of forming a plating layer on a surface of the soldering part may be further included, and the plating layer may be further formed so that the array substrate for mounting the chip is certainly soldered on the printed circuit board.

Next, in the cutting step (S300), the chip substrate as shown in FIGS. 6a to 6j may be manufactured by cutting the original chip substrate in which the soldering part and the protrusion part are formed along the cutting lines.

The cutting step may be performed in a state that a lower portion of the original chip substrate is fixed by an adhesive tape and the like.

When constructing the line source of light using the array substrate for mounting the chip according to another embodiment described above, it is not necessary to construct the optical device array by forming a predetermined interval with the display unit in order to construct an array by soldering the plurality of optical device chip packages like the conventional art and provide a sufficient amount of light by considering an emission angle, and since the emission angle emitted in a single structure is great, it is not necessary to form an interval for supplying an amount of light. Further, since it is not necessary to perform soldering the plurality of LED packages on the printed circuit board, a manufacturing step can be simplified, a color coordinate deviation of the light source for the BLU can be minimized, and the process can be further simplified.

The above description is only illustrative of embodiments of the spirit of this invention concept. Those skilled in the art will readily appreciate that many modifications, changes, and alternatives are possible without materially departing from the novel teachings and advantages.

Accordingly, the embodiments and the accompanying drawings disclosed in this specification are intended not to limit the scope of this inventive concept but to describe this inventive concept, and the scope of this inventive concept cannot be limited by the embodiments and the accompanying drawings. The scope of this inventive concept should be construed by the claims, and all concepts within the equivalent scope will be construed as being included in the scope of this inventive concept.

What is claimed is:

1. An array substrate for mounting a chip to a circuit board, the array substrate comprising:
   a plurality of conductive parts arranged in one direction, whereon a plurality of chips are mounted in the one direction, each of the plurality of conductive parts having a chip-mounting surface, and a back surface opposite the chip-mounting surface for mounting the array substrate to the circuit board;
   one or more insulating parts alternately arranged with the plurality of conductive parts for electrically separating the plurality of conductive parts,
   protrusion parts whose heights are different from that of a surface of the conductive parts whereon the chip is mounted, the protrusion parts being arranged at both ends and a central portion of the array substrate; and
   concave parts depressed in a lateral direction with respect to side surfaces of the array substrate, the concave parts being arranged only at the both ends and the central portion where the protrusion parts are arranged.

2. The array substrate according to claim 1, further comprising a plating layer formed on a surface of the concave parts.

3. The array substrate according to claim 1, wherein the protrusion parts comprise an inclined surface extending to and having an angle with respect to the surface of the conductive part.

* * * * *